(12) United States Patent
Chen et al.

(10) Patent No.: US 6,435,045 B1
(45) Date of Patent: Aug. 20, 2002

(54) APPARATUS AND METHOD FOR AUTOMATICALLY CHANGING THE PROBE HEAD IN A FOUR-POINT PROBE SYSTEM

(75) Inventors: James T. Chen, San Mateo; Gong Wang, Hayward, both of CA (US)

(73) Assignee: Four Dimensions, Inc., Hayward, CA (US)

( * ) Notice: Subject to any disclaimer, the term of this patent is extended or adjusted under 35 U.S.C. 154(b) by 0 days.

(21) Appl. No.: 09/389,687

(22) Filed: Sep. 2, 1999

Related U.S. Application Data
(60) Provisional application No. 60/099,139, filed on Sep. 4, 1998.

(51) Int. Cl.⁷ .............................................. G01M 19/00
(52) U.S. Cl. ...................................... 73/866.5; 324/754
(58) Field of Search ......................... 73/866.5; 324/74; 33/557; 702/127

(56) References Cited

U.S. PATENT DOCUMENTS

| | | | |
|---|---|---|---|
| 2,913,963 A | * 11/1959 | de Boer et al. | 33/18.1 |
| 4,069,590 A | * 1/1978 | Effinger | 33/523 |
| 4,637,119 A | * 1/1987 | Schneider et al. | 33/561 X |
| 5,073,912 A | * 12/1991 | Kobayashi et al. | 378/34 |
| 5,157,847 A | * 10/1992 | Perks | 33/836 |
| 5,471,148 A | * 11/1995 | Sigheimer et al. | 324/754 |
| 5,593,341 A | * 1/1997 | Gonnella et al. | 451/57 |
| 5,708,222 A | * 1/1998 | Yonezawa et al. | 73/865.8 |
| 5,795,990 A | * 8/1998 | Gitis et al. | 73/9 |
| 5,844,149 A | * 12/1998 | Akiyohsi et al. | 73/864.81 |
| 5,883,413 A | * 3/1999 | Eicole et al. | 73/865.8 |
| 6,040,699 A | * 3/2000 | Holmes | 324/754 |
| 6,166,550 A | * 12/2000 | Abramsohn et al. | 324/452 |

FOREIGN PATENT DOCUMENTS

| | | | |
|---|---|---|---|
| DE | 2204955 | * 8/1973 | B24B/7/16 |
| JP | 2-74843 | * 3/1990 | 324/754 |
| JP | 5-144898 | * 6/1993 | 73/866.5 |

OTHER PUBLICATIONS

Derwent–ACC–No. 1997–E9844 abstract of SU 533852A Assignee Pipe Ind Res Inst. "Tube metal plasticity test rig–has opposed transuer stocks in furnace compressing tube to oval shape", Nov. 1976.*

* cited by examiner

*Primary Examiner*—Thomas P. Noland
(74) *Attorney, Agent, or Firm*—Allston L. Jones

(57) ABSTRACT

Provided is a test system and method that permits automatically interchanging a plurality of tools to seamlessly perform various functions on a sample. Each tool is mounted in an assembly and the sample is mounted on a chuck. A path is defined in a plane along which the chuck is transported with the tools each positioned in the same attitude with respect to, and distance from, that path. The chuck is transported along the path to a position adjacent one of the tools and rotated, if necessary, to position a point of interest on the sample immediately adjacent the tool. Once positioned, the tool engages the sample to perform a test. Following testing, the tool is disengaged from the sample and the process repeated as necessary for each additional test to be performed on the sample. Thus, the apparatus and method of the present invention enables the sample on the chuck to be tested by any of the tools in the system at any site on the surface of the sample by transporting and rotating the chuck to positions adjacent various tools. Therefore, automatic changing of the tool among those installed in the system can be performed seamlessly saving valuable time and resources during production of various items. Notice that the sample-under-test can be changed by a robot in a larger system when the chuck is at a position along the defined path that is not located beneath a tool assembly.

13 Claims, 6 Drawing Sheets

APPARATUS AND METHOD FOR AUTOMATICALLY CHANGING THE PROBE HEAD IN A FOUR-POINT PROBE SYSTEM

CROSS-REFERENCE

This application claims priority from an earlier filed Provisional Patent Application having Serial No. 60/099,139 that was filed on Sep. 4, 1998.

BACKGROUND OF THE INVENTION

1. Field of the Invention

This invention relates to four-point systems and the ability to automatically change testing probe heads in-between two sample tests if a different probe head is required for the next test to be performed.

2. Description of the Background Art

Four-point probe systems are commonly used in device fabrications for monitoring processes such as metal film deposition and ion implantation. This is performed by measuring sheet resistivities of a test wafer processed with the wafer on which micro-devices are being manufactured for comparison to expected sheet resistivities. In the semiconductor industry if a first test was performed on a wafer with a metal film, and the next test to be performed is on ion-implanted wafer, it usually is necessary to change the probe head to get the best measurement results and avoiding cross contamination.

Up to now, changing of probe heads has been done manually for all four-point probe systems. Even in a fully automatic cassette-to-cassette system, there is only one probe head is installed in the system, and there is no provision for automatically changing that single probe head as the types of tests that need to be performed vary. There too that probe head must be changed manually. Changing probe heads is not only time consuming, but also makes it easy to introduce contaminating particles into the system's mini-environment. Furthermore, mistakes may also happen in changing the probe heads. The present invention overcomes each of these short comings of the prior art.

SUMMARY OF THE INVENTION

The present invention provides a test head system and method that permits the automatic interchange of a plurality of tooling as desired to perform various functions on a sample. The test head system of the present invention includes a frame with a base and a panel extending upward from the base. Mounted on the base is a fixed track that defines a travel path along which a carriage is supported and moved, the carriage in turn having a chuck rotationally mounted to support the sample. Additionally there is a rotational mechanism coupled to the chuck and carriage to position the chuck to a desired rotational position, and a drive mechanism attached to the carriage to move the carriage to a desired position along the fixed track. Also included is a plurality of tooling assemblies each affixed to the panel in a position relative to the fixed track to provide a tool opposite any point on the sample as the chuck is advanced and rotated to a position opposite any of the tooling assemblies. Note that the rotational and drive mechanisms are powered in conjunction with each other to position a desired point on the sample beneath a desired one of the tooling assemblies.

In the method of the present invention is provided to test a sample with a plurality of tools with each tool mounted in a separate tooling assembly and the sample to be tested mounted on a rotationally mounted chuck. The method is performed by defining a path in a plane along which the chuck is to be transported and positioning a plurality of tooling assemblies along that path, with each tooling assembly being positioned in a same attitude with respect to, and at a same distance from, the path, then the method includes transporting the chuck along the path to a position adjacent one of the tooling assemblies and rotating the chuck, if necessary, to position a point of interest on the sample immediately adjacent the tool of one of the tooling assemblies. Once positioned, the method proceeds with engaging the tool adjacent the sample with the sample and performing a test on the sample with the engaged tool. Following the testing the method proceeds with disengaging the tool from the sample and repeating the transporting, rotating, engaging, testing and disengaging steps as necessary for each additional test to be performed on the sample.

Thus, the apparatus and method of the present invention enables the sample on the chuck to be tested by any of the tools in the system at any site on the surface of the sample through transporting and rotating the chuck to a position adjacent the needed tool for the test at hand. Therefore, automatic changing of the tool among those installed in the system can be performed seamlessly saving valuable time and resources during production of various items. Notice that the sample-under-test can be changed by a robot in a larger system when the chuck is at a position along the defined path that is not located beneath a tool assembly.

DETAILED DESCRIPTION OF AN EMBODIMENT OF THE PRESENT INVENTION

Figure 1:
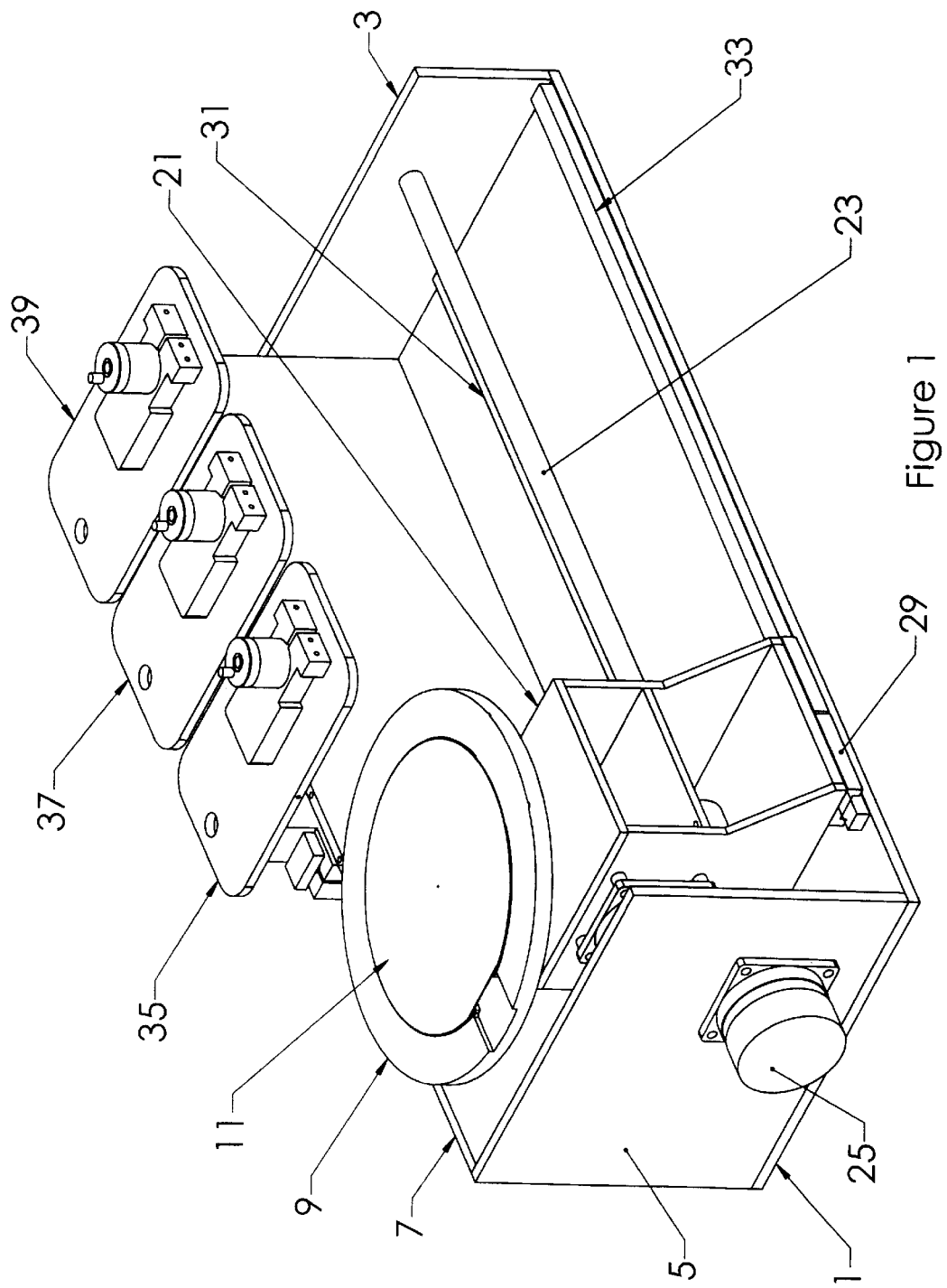
FIG. 1 is a top left side perspective view of an embodiment of an automatic probe head changing mechanism of the present invention with the chuck in a home position.
Figure 2:
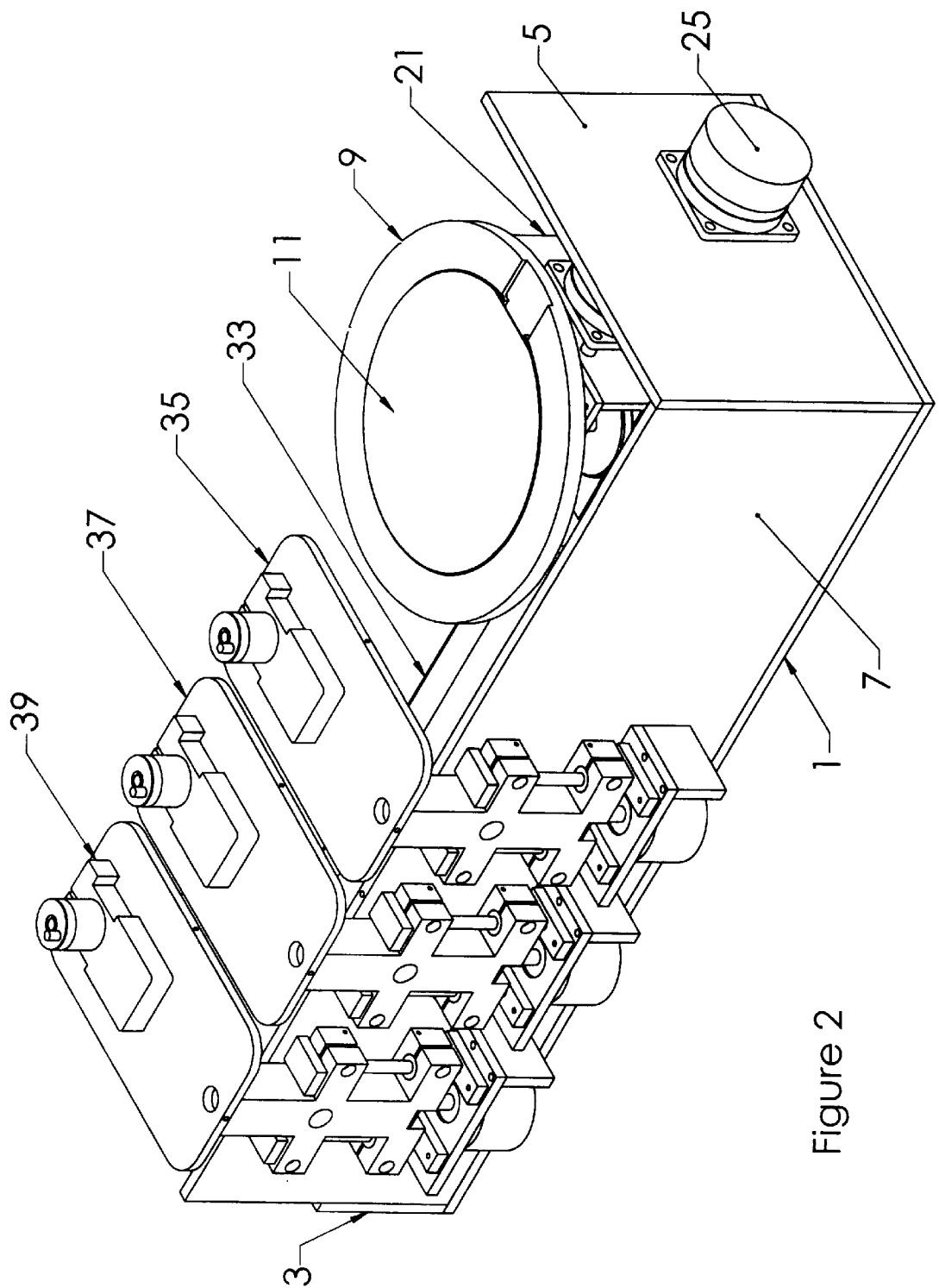
FIG. 2 is a top right side perspective view of an embodiment of an automatic probe head changing mechanism of the present invention with the chuck in a home position.
Figure 3:
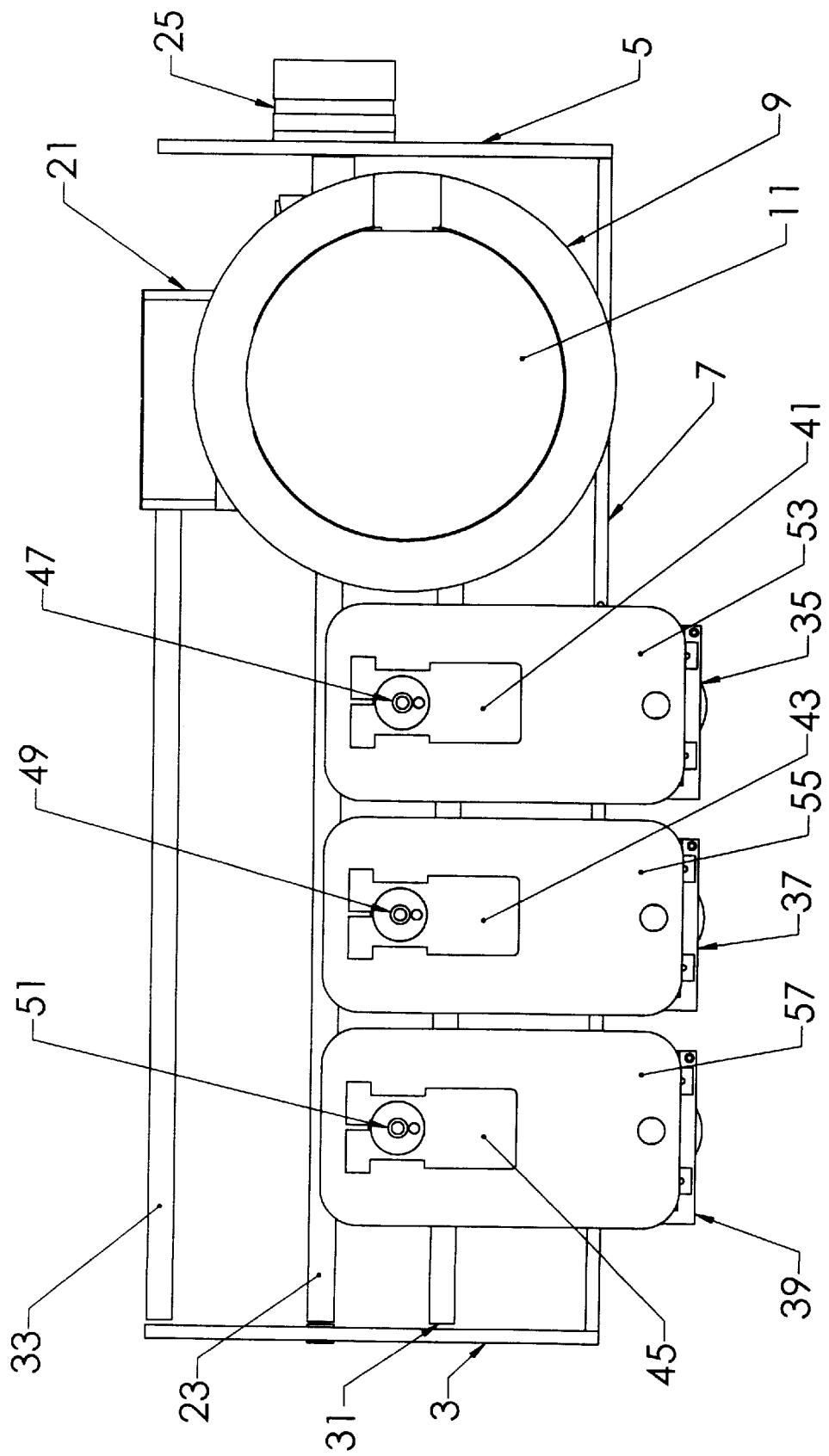
FIG. 3 a top view of the automatic probe head changing mechanism of FIGS. 1 and 2 with the chuck in a home position.

FIGS. 1 through 4 show various views of the chuck and probe head mechanism of the present invention for automatically changing probe heads that interface with a chuck holding a wafer for different types of tests on the wafer. The assembly includes base plate 1 on which end plates 3 and 5, and probe support panel 7 are mounted vertically with end plates 3 and 5 mounted perpendicularly to opposite ends of probe support panel 7. Oriented horizontally intermediate end plates 3 and 5 is chuck 9, the underside of which extends above probe support panel 7 with chuck 9 being provided to support a wafer 11 (e.g., a semiconductor wafer). In turn, chuck 9 is supported on a central shaft 13 about which chuck 9 is turned with shaft 13 being turned selectively by stepper motor 15 via shaft 17 and gear assembly 19, all of which are supported by carriage 21.

Carriage 21 in turn has affixed to the bottom thereof two sets of block mounts 29 which individually rest on linear guide rails 31 and 33 to support carriage 21. Each of guide rails 31 and 33 are affixed to base plate 1 to provide a linear track along which carriage 21 is selectively advanced to move chuck 9 to a desired position. To provide the motivating force to carriage 21, stepper motor 25 is mounted on the outside of end plate 5 with the motor shaft extending through end plate 5. Attached to the shaft of stepper motor 25 is coupling 24 which in turn is attached to the proximate end of ball screw 23 with the distal end of ball screw 23 mounted in a bearing in end plate 3. Between end plates 3 and 5, ball screw 23 extends through carriage 21 and ball nut 27 that is affixed to carriage 21. Thus, stepper motor 25 selectively turns ball screw 23 which in turn moves carriage 21 by means of attached ball nut 27.

Probe support assemblies 35, 37 and 39 are mounted on the outer side of probe support panel 7 with probe support plates 53, 55 and 57, respectively, extending across probe support panel 7 and above the track of chuck 9. Within the end that extends over the track of chuck 9, each of probe support plates 53, 55 and 57 includes probe mount blocks 41, 43 and 45, respectively, with probes 47, 49 and 51 pointing vertically downward and contained within a respective one of probe mount blocks 41, 43 and 45.

Figure 4:
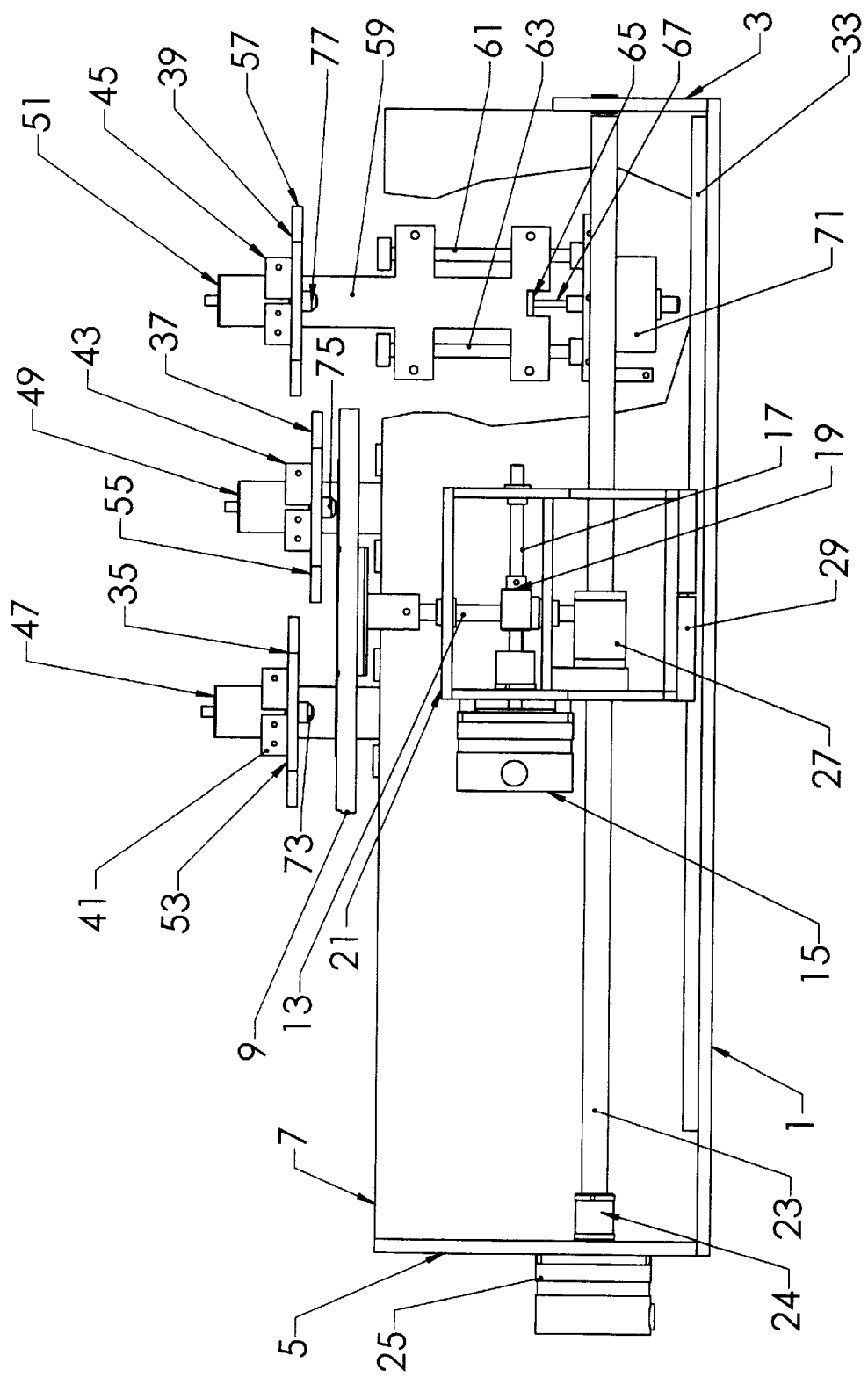
FIG. 4 is a left side view of the automatic probe head changing mechanism of FIGS. 1 and 2 with the chuck opposite the second probe head.

Referring now specifically to FIG. 4, carriage 21 is shown advanced to a position with chuck 9 located immediately beneath probe 49. Additionally a portion of probe support panel 7 has been cut away with the third probe support assembly 39, which is normally attached to the portion of panel 7 that has been cut away, shown in place as if the cut-away had not been made. Probe support assembly 39 includes probe support plate 57 secured to the top of lower arm 59. Lower arm 59 in turn is slidably mounted on vertical shafts 61 and 63. At the lower end of lower arm 59 there is a horizontal flange 65 extending into the page (shown with a broken outline) that is in contact with plunger 67 of electromagnetic actuator 71. Therefore, by varying the activation signal to actuator 71, raising or lowering lower arm 59, probe tip 77 can be raised or lowered. Each of probe support assemblies 35 and 37 are similarly constructed and controlled.

Upon further examination of FIG. 4 it can be seen that probe tip 75 of the second probe support assembly 37 is in the lower position for performing tests on wafer 11 on chuck 9, while probe tip 73 of the first probe support assembly 35, like probe tip 77 of probe support assembly 39, is in the up position. Since chuck 9 is only positioned for testing beneath one probe at a time, only one of probe tips 73, 75 and 77 can be down at any one time, thus the default position of each probe tip is the up position until chuck 9 has been moved into position beneath a particular one of the probe tips and wafer 11 has been positioned for testing.

Figure 5:
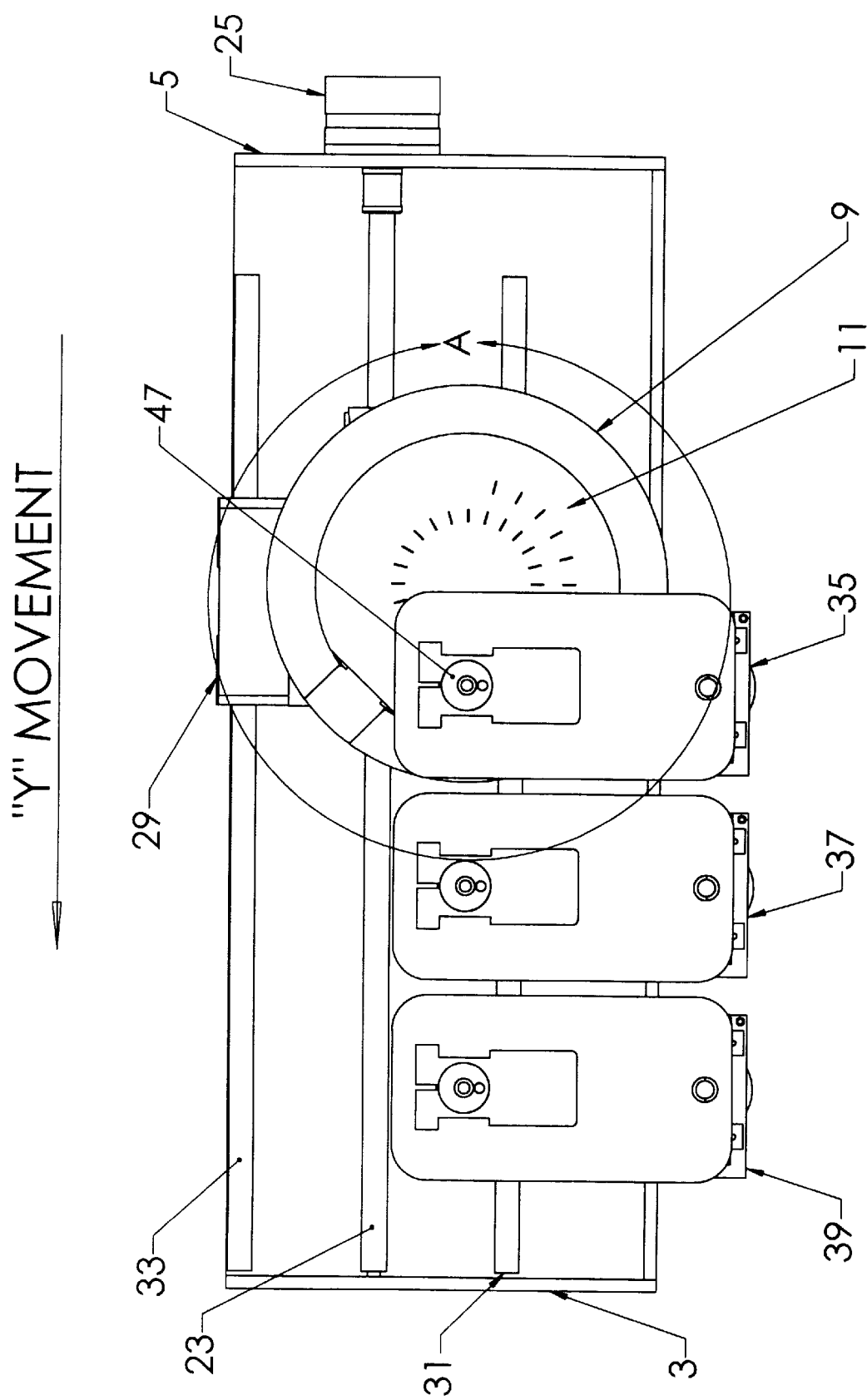
FIG. 5 is a top view of the automatic probe head changing mechanism of FIGS. 1 and 2 with the chuck moved to be opposite the first probe head.
Figure 6:
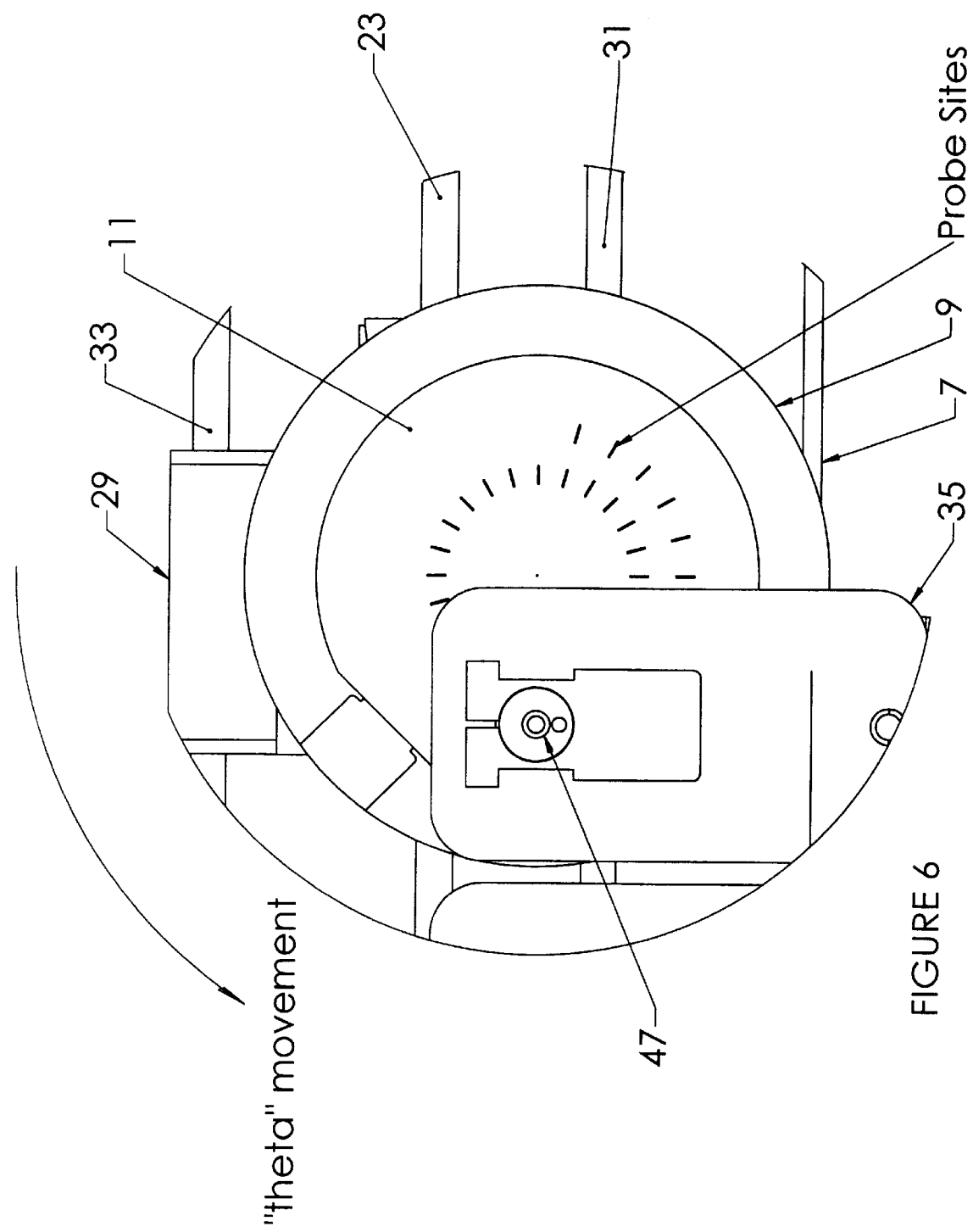
FIG. 6 is a close-up top view of the automatic probe head changing mechanism of FIG. 5 with the chuck engaged by the first probe head.

FIG. 5 is a simplified top view of the chuck and probe head mechanism of the present invention with chuck 9 having been advanced along linear guide rails 31 and 33 in the Y-direction from the home position to place wafer 11 beneath the first probe 47. FIG. 6 shows a close-up of the positioning of chuck 9 with wafer 11 beneath probe 47 as shown in FIG. 5. From FIGS. 4 and 6 it can thus be seen that wafer 11 may be rotationally positioned as desired beneath probe 47 by activating stepper motor 15. While FIGS. 5 and 6 only show wafer 11 opposite probe 47, it is also clear that wafer 11 can be similarly positioned beneath probes 49 and 51.

In summary, when a sample is to be tested, it is placed on chuck 9 with chuck 9 in the loading, or home, position as shown in FIG. 1. Then chuck 9 can be linearly transported with stepper motor 25 and rotated angularly with stepper motor 15 into position so that the desired test spot on wafer 11 is beneath the desired probe. Then the selected probe head is lowered into position above the test point on wafer 11 by activation of the actuator that corresponds to the selected probe head (e.g., in FIG. 4 probe head 75 is controlled with an actuator that is not shown similar to actuator 71 that controls probe head 77). The entire operation can thus be controlled for positioning the same spot on the sample-under-test beneath a selected probe, as well as controlling the test itself. Computer-controlled automatic changing of the probe head for testing is thus realized.

While the specific embodiment discussed above with respect to the included figures shows a system having three probe test stations, that number can clearly be extended to any desired number of test stations and incorporate any variety of probes desired. Additionally, while rails 31 and 33 have been shown to have a rectangular cross-section in the figures, the cross-sectional shape of the rails can have any shape (e.g., circular, half-circular, elliptical, half elliptical, triangular, etc.), and only one rail or more than two rails may also be used depending on the stability required. Further, while the system of the present invention has been shown in the figures as being linearly oriented and mounted on straight rails 31 and 33, the rails could take any shape (e.g., curved, snake like, etc.) to move wafer 11 beneath a selected probe head using a chain or cable drive to move carriage 21 into position with stepper motor 15 still used to position wafer 11 angularly. Also, while the motive devices have been described as stepper motors and electromagnetic actuators, they are merely a matter of design choice and other types of motive devices could be used instead.

While the present invention has been describe in the single embodiment of the figures, the present invention is not limited to that design. Seeing the design disclosed here, one skilled in the mechanical arts could easily make alternative equivalent designs, thus the present invention and the coverage provided here is only to be limited by the scope of the accompanying claims.

What is claimed is:

1. A test head system to permit the automatic interchange of a plurality of probes as desired to perform various functions on a sample, said test head system comprising:

a frame having a base and a panel extending upward from said base;

a fixed track mounted on said base to define a travel path along said fixed track;

a carriage supported on said fixed track;

a chuck rotationally mounted on said carriage to support said sample;

a rotational mechanism coupled to said chuck and said carriage to rotationally move said chuck in opposing directions to a desired rotational position;

a drive mechanism attached to said carriage to move said carriage in opposing directions to a desired position along said fixed track; and a plurality of probe assemblies each affixed to said panel in a position relative to said fixed track to provide a probe opposite any point on said sample as said chuck is advanced and rotated to a position opposite any of said probes;

wherein said rotational mechanism and said drive mechanism are powered in conjunction with each other to position a desired point on said sample beneath a desired one of said probes.

2. The test head system as in claim 1 wherein each probe assembly includes:

a test head including a probe for use with said sample;

a test head support to hold said test head in a default position extended away from said panel and above a plane traced by a top surface of said chuck as said carriage is moved along said fixed track; and an actuation subsystem affixed to said panel and coupled to said test head support to lower said test head to said sample when said sample is positioned beneath said test head for use of said probe on said sample and to raise said test head to, and maintain it at, a default height that is spaced above said plane traced by said chuck when said probe is not in use.

3. The test head system as in claim 2 wherein:

said chuck is mounted in said carriage;

each of said plurality probe assemblies is affixed to said panel;

each test head support holds a corresponding test head in a default position extended away from said panel; and each actuation system is affixed to said panel and coupled to a corresponding test head support.

4. The test head system as in claim 1 wherein:

said chuck includes a downwardly extending centrally located shaft about which said chuck can be turned; and said rotational mechanism includes a first stepper motor coupled to the central shaft of said chuck to control the rotational position of said chuck.

5. The test head system as in claim 1 wherein said drive mechanism includes a second stepper motor coupled to said carriage to control the position of said carriage along said fixed track.

6. The test head system as in claim 5 wherein:

said second stepper motor is mounted on said frame; and said drive mechanism further includes:
  a power transmission subsystem coupled to said second stepper motor; and
  a coupling affixed to said carriage and coupled to said power transmission subsystem to provide movement of said carriage along said fixed track.

7. The test head system as in claim 6 wherein:

said fixed track defines a straight travel path;

said coupling affixed to said carriage includes a ball nut; and said power transmission subsystem includes a ball screw that passes through said ball nut.

8. The test head system as in claim 6 wherein said fixed track defines a curved travel path.

9. The test head system as in claim 8 wherein said curved travel path includes different radii of curvature.

10. A test head system as in claim 1 wherein:

each probe of each of said probe assemblies has a tip that defines a point in a same horizontal plane when each probe is not in use;

each probe of each of said probe assemblies defines a vertical central axis; and each of the vertical central axes when extended to said base are the same distance from said fixed track.

11. The test head system as in claim 10 wherein each probe assembly includes:

a test head including a probe for use with said sample;

a test head support to hold said test head extended away from said panel to position said test head in a default position above a plane defined by a top of said chuck as said carriage is moved along said fixed track; and an actuation subsystem affixed to said panel and coupled to said test head support to lower said probe to said sample when said sample is positioned beneath said probe to use said probe on said sample and, when said probe is not in use, to raise and maintain said test head at a height that is spaced above said plane defined by said chuck.

12. The test head system as in claim 11 wherein:

each test head support holds a corresponding test head extended away for said panel; and each actuation subsystem is affixed to said panel and coupled to a corresponding test head support.

13. The test head system as in claim 1 wherein:

said chuck is mounted in said carriage; and each of said plurality of probe assemblies is affixed to said panel.

* * * * *